United States Patent
Matuki

[19]

[11] Patent Number: 6,052,767
[45] Date of Patent: Apr. 18, 2000

[54] SEMICONDUCTOR DEVICE HAVING REDUNDANT MEMORY CELL ARRAYS AND SERIALLY ACCESSING ADDRESSES

[75] Inventor: Syouzi Matuki, Tokyo, Japan

[73] Assignee: NEC Corporation, Tokyo, Japan

[21] Appl. No.: 08/903,375

[22] Filed: Jul. 30, 1997

[30] Foreign Application Priority Data

Jul. 30, 1996  [JP]  Japan ................................. 8-200311

[51] Int. Cl.[7] .................................................. G06F 12/08
[52] U.S. Cl. .............................. 711/202; 711/5; 365/200; 714/7
[58] Field of Search ..................... 395/182.04, 182.05; 711/5, 202; 365/200, 202, 210; 714/6, 7, 8

[56] References Cited

U.S. PATENT DOCUMENTS

| | | | |
|---|---|---|---|
| 5,088,066 | 2/1992 | Castro | 365/230.06 |
| 5,206,831 | 4/1993 | Wakamatsu | 365/200 |
| 5,297,094 | 3/1994 | Rastegar | 365/210 |
| 5,303,192 | 4/1994 | Baba | 365/200 |
| 5,353,253 | 10/1994 | Nakajima | 365/200 |
| 5,406,566 | 4/1995 | Obara | 714/719 |
| 5,604,702 | 2/1997 | Tailliet | 365/200 |
| 5,644,699 | 7/1997 | Yoshida | 395/182.05 |
| 5,646,896 | 7/1997 | Pinkham | 365/200 |
| 5,706,292 | 1/1998 | Merritt | 714/710 |
| 5,708,619 | 1/1998 | Gillingham | 365/230.06 |
| 5,781,717 | 7/1998 | Wu et al. | 714/8 |
| 5,864,562 | 1/1999 | Pascucci | 371/10.2 |

FOREIGN PATENT DOCUMENTS

4-26999  1/1992  Japan.

Primary Examiner—John W. Cabeca
Assistant Examiner—Pierre-Michel Bataille
Attorney, Agent, or Firm—Foley & Lardner

[57] ABSTRACT

In order to prevent a delay in the judgement of a judging result obtained by determining whether a memory cell specified by address signals supplied serially from the outside is a defective memory cell, a semiconductor device includes a memory cell array having a plurality of memory cells for writing data to and reading the same from an address specified by the external address signals. Data are written into and read from redundant memory cell arrays in place of a defective memory cell when the defective memory cell exists in the memory cell array. A judging circuit judges whether or not an input address corresponds to an address of the defective memory cell. In the semiconductor memory to which addresses are serially inputted, the judging circuit sequentially judges whether or not the serially-input addresses are addresses of defective memory cells.

12 Claims, 8 Drawing Sheets

SEMICONDUCTOR DEVICE HAVING REDUNDANT MEMORY CELL ARRAYS AND SERIALLY ACCESSING ADDRESSES

BACKGROUND OF THE INVENTION

1. Field of the Invention

The present invention relates to a semiconductor device, such as a semiconductor memory or the like, and to a semiconductor device which has redundant memory cell arrays and serially accesses addresses.

2. Description of the Related Art

A semiconductor device of this type has heretofore been used for the sake of judging whether or not an address specified by a pair of address signals serially supplied from the outside corresponds to any of addresses of defective memory cells. As a result of judgement, when a defective memory cell exists in a memory cell array, the defective memory cell is replaced by a corresponding redundant memory cell for writing data therein and reading it therefrom. A memory selective unit of this type of semiconductor device has a redundant memory selective circuit, a serial/parallel conversion circuit, and a counter. The redundant memory selective circuit outputs a memory selective signal MS for bringing the memory cell array and each of the redundant memory cell arrays to operating and non-operating states respectively. When the specified address is found to be an address of a normal memory cell, the redundant memory selective circuit brings the memory selective signal to a high level. When the specified address is found to be the address of the defective memory cell, the redundant memory selective circuit brings the memory selective signal to a low level. Thus, the defective memory cell can be relieved by being replaced with the redundant memory cell array.

The serial/parallel conversion circuit converts the serial address signals to parallel address signals respectively. Thereafter, the redundant memory selective circuit judges whether or not the specified address corresponds to the address of the defective memory cell. In this case, the redundant memory selective circuit outputs a memory selective signal therefrom. When the specified address is of the address of the normal memory cell, the memory selective signal is brought to the high level. On the other hand, when the specified address is of the address of the defective memory cell, the memory selective signal is brought to the low level.

When the defective memory cell is specified by the memory selective signal, it is replaced by the redundant memory cell array. This replacement is performed after the elapse of one cycle from the completion of each serial address. This means that the writing of data to and reading of the same from the memory cell array must also wait for decision made by the memory selective signal, so as to be performed after one cycle or later from the completion of each serial address.

Namely, since the redundant memory selective circuit in the conventional semiconductor device is not supplied with those other than the external addresses in its structure after it has been reset by a precharge signal, it is necessary to provide a flip-flop for latching only the parallel-converted external addresses at a final stage of the serial/parallel conversion circuit and set a cycle in which the flip-flop latches the addresses. Therefore, the determination of the memory selective signal is performed after one cycle since the completion of the serial addresses. Thus, the conventional semiconductor device has a drawback in that the writing and reading of data into and from the memory cell array are also performed after this cycle, thus resulting in interference with the speeding up of a memory access.

Further, the semiconductor device has a drawback in that when the external addresses have specified the address of the defective memory cell, the redundant memory selective circuit requires time to bring the memory selective signal to the low level and hence this interferes with the speeding up of the memory access even from this point of view.

Moreover, the semiconductor device has a drawback in that loads on COMP (complementary) signals become heavy which include the capacities of diffused layers of transistors provided by the same number as the number of bits of addresses and the capacities of fuses or the like. Even when each external address differs from the address of the defective memory cell only by a single bit, the memory selective signal must be put into a low level under a heavy load situation of the transistors.

SUMMARY OF THE INVENTION

With the foregoing problems in view, it is therefore an object of the present invention to provide a semiconductor device capable of speeding up a decision about a memory selective signal for replacing a defective memory cell by a redundant memory cell when a memory cell specified by external addresses is found to be defective.

It is another object of the present invention to provide a memory selective circuit suitable for use in a semiconductor device, which is electrically connected to a memory cell array having redundant memory cell arrays and is capable of speeding up a decision about a memory selective signal for replacing a defective memory cell by a redundant memory cell when a memory cell specified by external addresses is found to be defective as the defective memory cell.

According to one aspect of the present invention, for achieving the above objects, there is provided a semiconductor device which comprises a memory cell array having a plurality of memory cells and for writing data to and reading the same from each of addresses specified by external address signals, redundant memory cell arrays for respectively writing data therein and reading the same therefrom in place of a defective memory cell when the defective memory cell exists in the memory cell array, and a memory selective unit for making a decision as to whether or not each of input addresses corresponds to an address of the defective memory cell, and which is inputted with addresses serially. The memory selective unit comprises defective address judging means which sequentially judges whether or not the serially-input addresses correspond to the addresses of the defective memory cells.

According to another aspect of the present invention, there is provided a memory selective unit suitable for use in a semiconductor device, which determines whether or not an address specified by external serial address signals indicates a defective memory cell, to replace the defective memory cell with a redundant memory cell for writing data into and reading it therefrom when the defective memory cell exists in a memory cell array for writing data to and reading it therefrom in accordance with the specified address, which comprises a defective address judging means for sequentially judging as to whether or not each input address corresponds to an address of the defective memory cell. Preferably, the defective address judging means comprises a parallel/serial conversion circuit for capturing each of the addresses of the defective memory cells based on an externally-input SA start signal and converting the address to a serial defective memory cell address synchronized with timing provided to shift each of external serial addresses, and a logical circuit for comparing the serial defective memory cell address and the external serial address for each bit and outputting an identity signal to the redundant memory selective circuit when they are found to coincide with each other from the result of comparison and outputting a non-identity signal thereto when they are found not to coincide with other from the result of comparison.

DESCRIPTION OF THE PREFERRED EMBODIMENTS

A semiconductor device according to the prior art will be described with reference to FIGS. 1 through 5 to provide easy understanding of the present invention prior to the description of preferred embodiments of the present invention.

Figure 1:
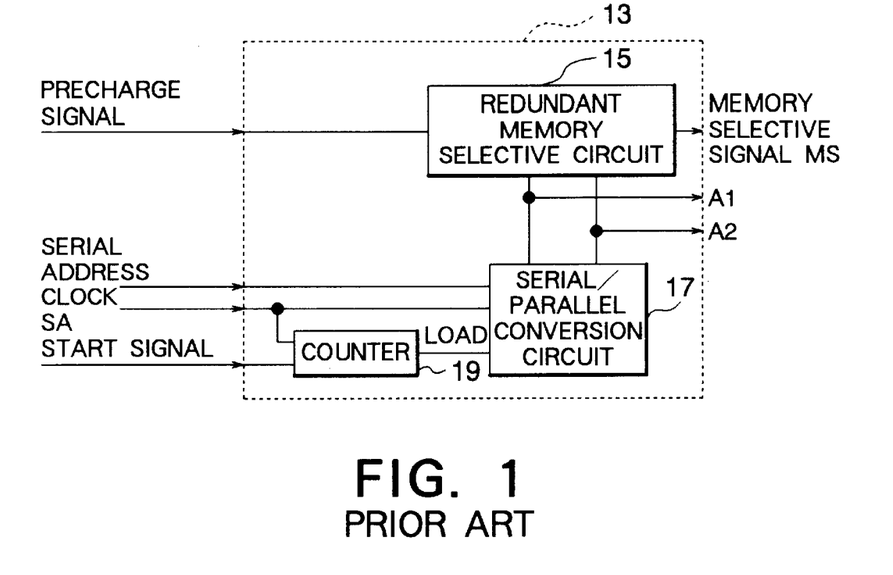
FIG. 1 is a diagram showing one example of a conventional judging circuit for comparing each of external serial addresses and an address of a defective memory cell.

Referring to FIG. 1, a memory selective unit 13 employed in the conventional semiconductor device comprises a redundant memory selective circuit 15, a serial-to-parallel (serial/parallel) conversion circuit 17, and a counter 19.

Figure 2:
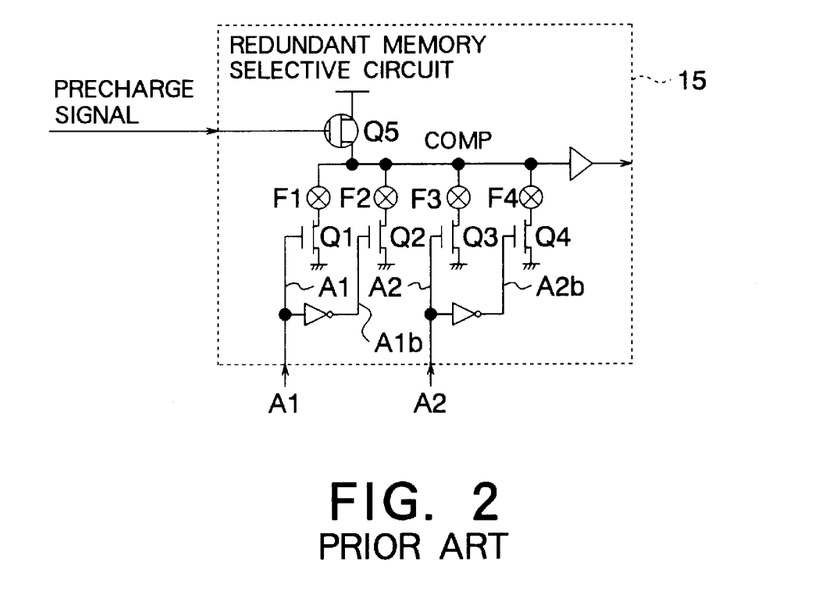
FIG. 2 is a circuit diagram for actually comparing each of external serial addresses and an address of a defective memory cell by the judging circuit shown in FIG. 1.

Referring to FIG. 2, the redundant memory selective circuit 15 has a plurality of first transistors Q1 through Q4 whose gates are supplied or inputted with signals (A1, A1b, A2 and A2b) complementary to respective bits of address signals (A1 and A2) so as to correspond thereto. Further, the redundant memory selective circuit 15 has a plurality of fuses F1 through F4 whose one ends are electrically connected to the drains of the first transistors Q1 through Q4 in association therewith respectively. Moreover, the redundant memory selective circuit 15 has a second transistor Q5 whose drain is electrically connected commonly to other ends of these fuses F1 through F4 and whose source is electrically connected to a power supply (voltage Vcc).

The redundant memory selective circuit 15 outputs a memory selective signal MS for bringing the memory cell array and each of the redundant memory cell arrays to operating and non-operating states from the drain of the second transistor Q5.

As will be described specifically, when a defective memory cell exists in the memory cell array, the memory selective signal MS is generated by blowing or cutting off a predetermined fuse of the plurality of fuses F1 through F4 in accordance with any of addresses of defective memory cells. When the address signals (A1 and A2) specify an address of a normal memory cell in the memory cell array, the redundant memory selective circuit 15 brings the memory cell array to the operating state and simultaneously bring the redundant memory cell array to the non-operating state.

On the other hand, when the address signals A1 and A2 specify an address of a defective memory cell in the memory cell array, the redundant memory selective circuit 15 brings the memory cell array to the non-operating state and brings the redundant memory cell array to the operating state.

When the defective memory cell exists in addresses at which the address signals A1 and A2 are (01), for example, the redundant memory selective circuit 15 shown in FIG. 2 may blow or cut off the fuses F2 and F3 to which the address signals (A1b and A2) of the address signals (A1, A1b, A2 and A2b), which take "1", are inputted.

Thus, the blowing of the fuses F1 through F4 by the redundant memory selective circuit 15 allows the memory selective signal MS to be taken high in level at the address of the normal memory cell and to be taken low in level at the address of the defective memory cell. Thus, the defective memory cell can be relieved by being replaced with its corresponding redundant memory cell array.

Figure 3:
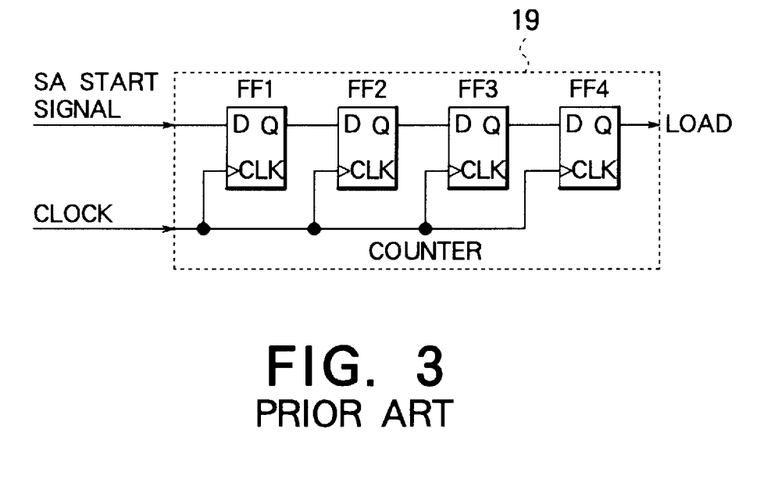
FIG. 3 is a block diagram illustrating one example of a counter shown in FIG. 1.

Referring to FIG. 3, the counter 19 starts counting in response to an SA (serial address) start signal for notifying the start of each serial address. Upon completion of serial/parallel conversion on each address, the counter 19 generates a LOAD signal therefrom. The SA start signal may be supplied to the counter 19 from the outside. Alternatively, the counter 19 may generates it thereinside based on external signals.

Figure 4:
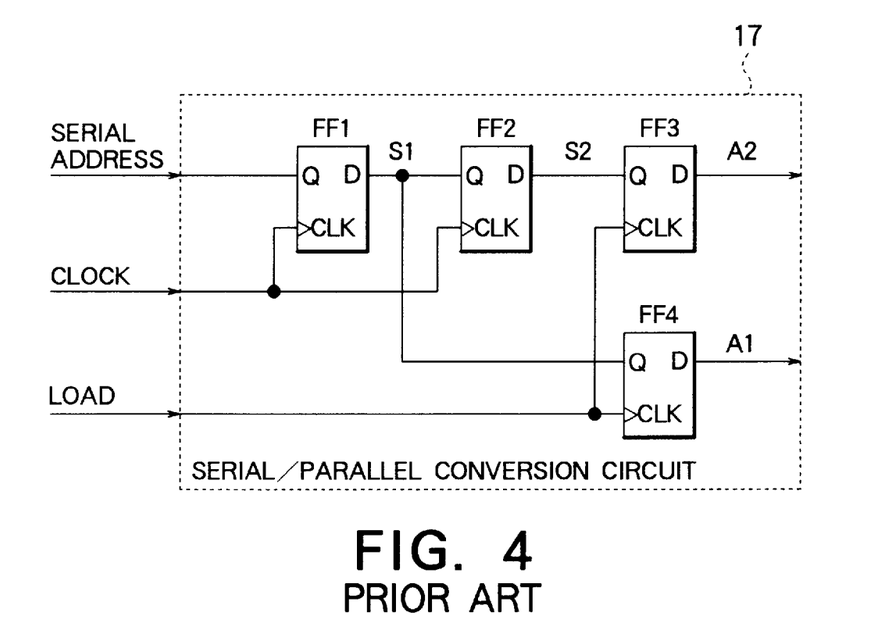
FIG. 4 is a block diagram depicting one example of a serial/parallel conversion circuit shown in FIG. 1.

Referring to FIG. 4, the serial/parallel conversion circuit 17 comprises four flip-flop circuits FF1 through FF4. When addresses are serially accessed to supply addresses corresponding to the first transistors Q1 through Q4, they are subjected to parallel conversion. Thereafter, the serial/parallel conversion unit 17 outputs the converted signals therefrom in response to the LOAD signal supplied from the counter 19.

Figure 5:
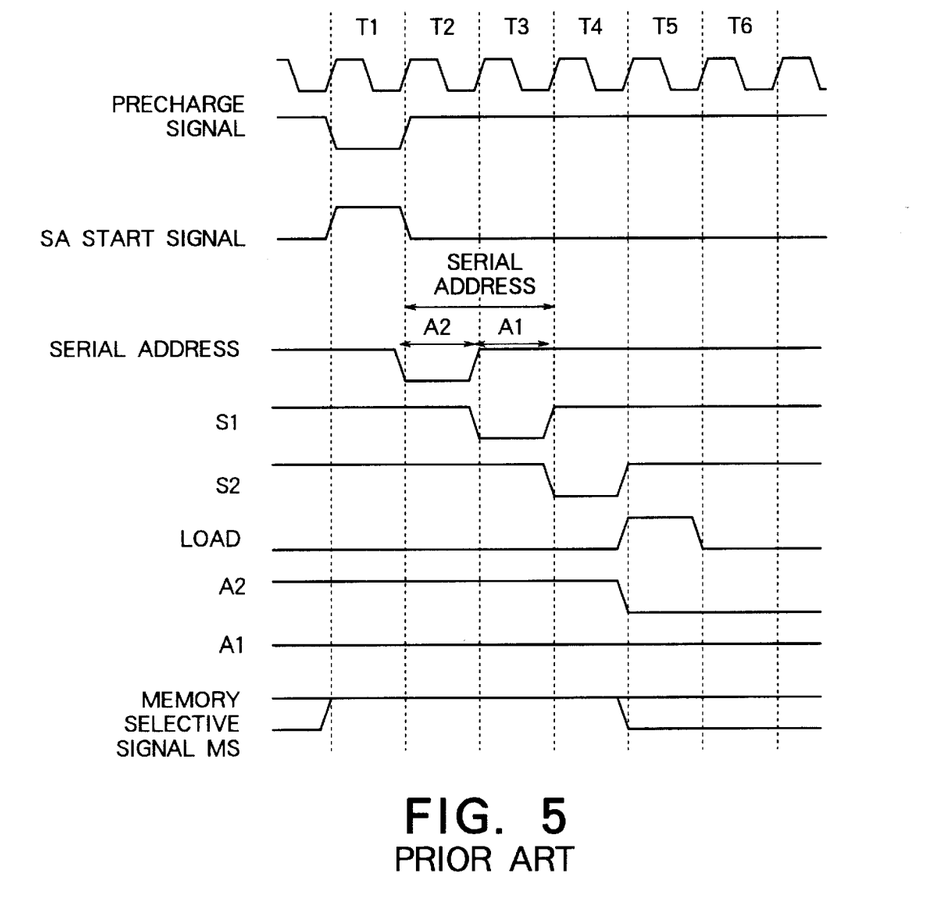
FIG. 5 is a timing chart for describing the operation of a conventional memory selective unit for comparing each of external serial addresses and an address of a defective memory cell.

Operation of the memory selective unit 13 employed in the semiconductor device shown in FIG. 1 will next be described using a timing chart shown in FIG. 5. Referring to FIG. 5, the redundant memory selective circuit 15 is first reset in response to a precharge signal (T1). In the circuit diagram shown in FIG. 2, a high level of the memory selective signal MS is a reset value. When the serial addresses are started, the serial/parallel conversion circuit 17 immediately takes in the serial addresses and starts their serial-to-parallel conversion (T2 and T3). Simultaneously, the counter 19 also starts counting in response to the SA start signal (T2). Upon completion of the address parallel conversion, the counter 19 generates the LOAD signal therefrom (T5). The serial/parallel conversion circuit 17 outputs the parallel addresses converted based on the LOAD signal. Further, the redundant memory selective circuit 15 makes a judgement as to whether or not the specified address corresponds to the address of the defective memory cell.

Thus, when the memory selective signal MS is decided, i.e., the address of the normal memory cell is judged, the memory selective signal MS is rendered high in level. When the address of the defective memory cell is judged, the memory selective signal MS is brought to a low level. The defective memory cell is replaced by the redundant memory cell array after one cycle has elapsed from the completion of the serial addresses (T5). Since the writing of data to and reading it from the memory cell array must wait for the decision of the memory selective signal MS, they are also performed after the elapse of one cycle from the completion of the serial addresses.

The preferred embodiments of the present invention will now be described with reference to FIGS. 6 through 11.

First embodiment

Figure 6:
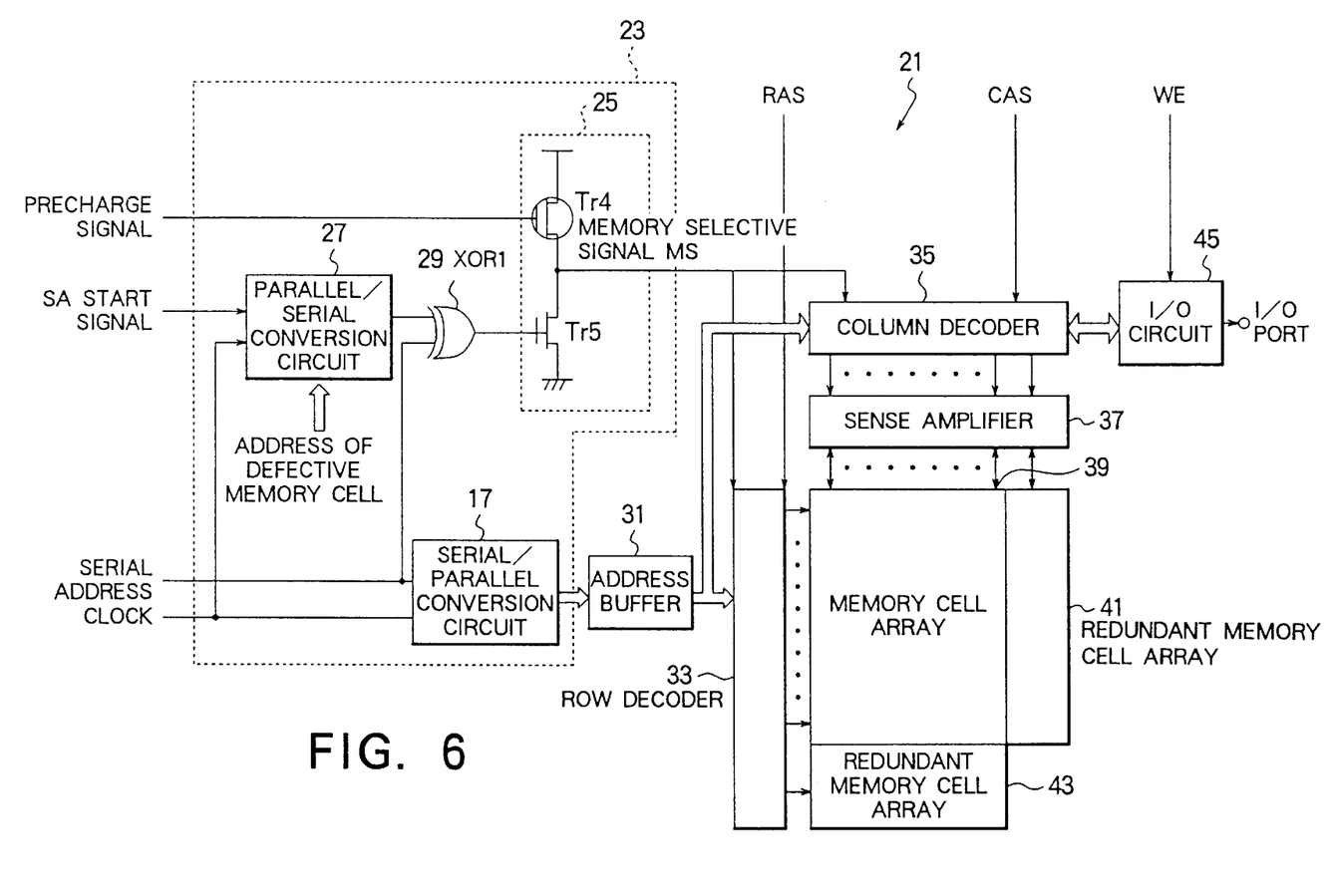
FIG. 6 is a block diagram showing the overall configuration of a first embodiment of a semiconductor device of the present invention.

Referring to FIG. 6, a semiconductor device 21 according to a first embodiment of the present invention has a memory selective unit 23 for inputting a precharge signal, an SA start signal, serial addresses and a clock therein and outputting a memory selective signal MS and parallel addresses (A1, A2, A3 and A4) therefrom. The memory selective unit 23 comprises a redundant memory selective circuit 25, a parallel/serial conversion circuit 27, a serial/parallel conversion circuit 17 similar to the conventional one, and an exclusive OR operation circuit (XOR1) 29. The redundant memory selective circuit 25 has transistors Tr4 and Tr5.

Further, the semiconductor device 21 includes an address buffer 31 for taking the parallel addresses therein and temporarily storing them therein, a row decoder 33 for inputting parallel addresses outputted from the address buffer 31, the memory selective signal MS and a RAS (row address strobe) therein, and a column decoder 35 for inputting the parallel addresses outputted from the address buffer 31, a CAS (column address strobe), and the memory selective signal MS.

Moreover, the semiconductor device 21 has a sense amplifier 37 electrically connected to the output side of column decoder 35 and for amplifying the difference in potential between bit lines so as to reach the difference between a source voltage at writing and a source voltage at reading, a memory cell array 39 electrically connected to the output side of the row decoder 33 and electrically connected to the sense amplifier 37, and redundant memory cell arrays 41 and 43 placed side by side with the memory cell array 39. The memory cell array 39 writes data to and reads it from an address specified by each of external address signals. The redundant memory cell arrays 41 and 43 write data to and read it to the corresponding address in place of a defective memory cell when the defective memory cell exists in the memory cell array 39. Incidentally, the sense amplifier 37 is electrically connected to an input/output circuit 45 electrically connected to an I/O port and supplied with a WE (write enable).

Here, the RAS is a signal for taking in or capturing a row address, selecting a corresponding word and activating the sense amplifier 37. Further, the CAS is a signal for capturing a column address, selecting a corresponding digit source and allowing the input and output of data. Moreover, the WE is a signal for performing a write operation (data output) upon activation and performing a read operation (data input) upon inactivation.

Figure 7:
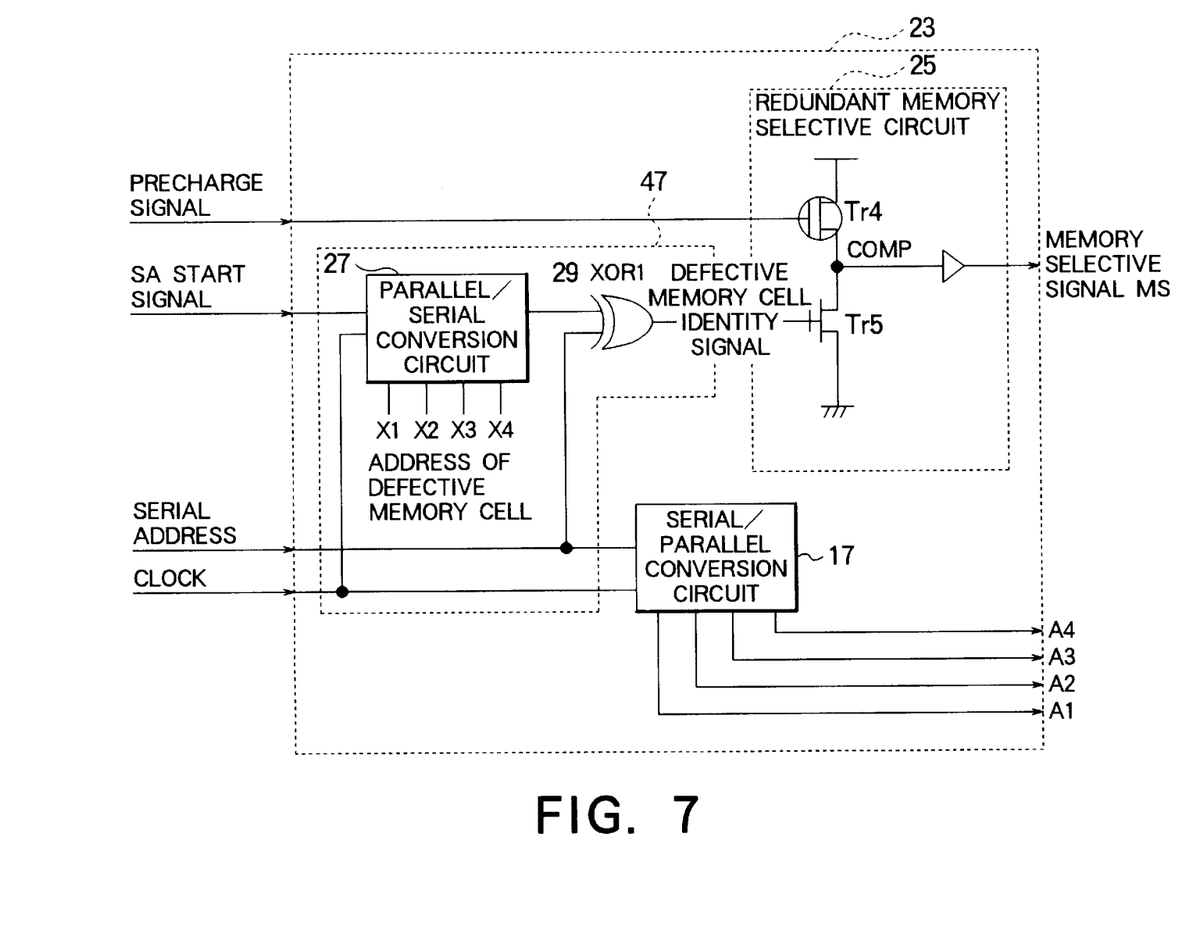
FIG. 7 is a block diagram illustrating a configuration of a memory selective unit of a semiconductor device shown in FIG. 6.

Referring to FIG. 7, the memory selective unit 23 includes a judging circuit 47 used as defective address judging element for making a judgement as to whether each of input addresses corresponds to an address of a defective memory cell, a redundant memory selective circuit 25 for outputting a memory selective signal MS, based on the result of judging by the judging circuit 47, and a serial/parallel conversion circuit 17 for converting each input serial address into a parallel address.

The judging circuit 47 comprises a parallel-to-serial (parallel/serial) conversion circuit 27 activated when an SA start is inputted thereto, and an exclusive OR operation circuit (XOR1) 29 composed of a comparator for comparing the output of the parallel/serial conversion circuit 27 and each serial address.

In the redundant memory selective circuit 25, the P-type transistor Tr4 is an output transistor for bringing the memory selective signal MS to a high level. Further, the N-type transistor Tr5 is an output transistor for bringing the memory selective signal MS to a low level.

Figure 8:
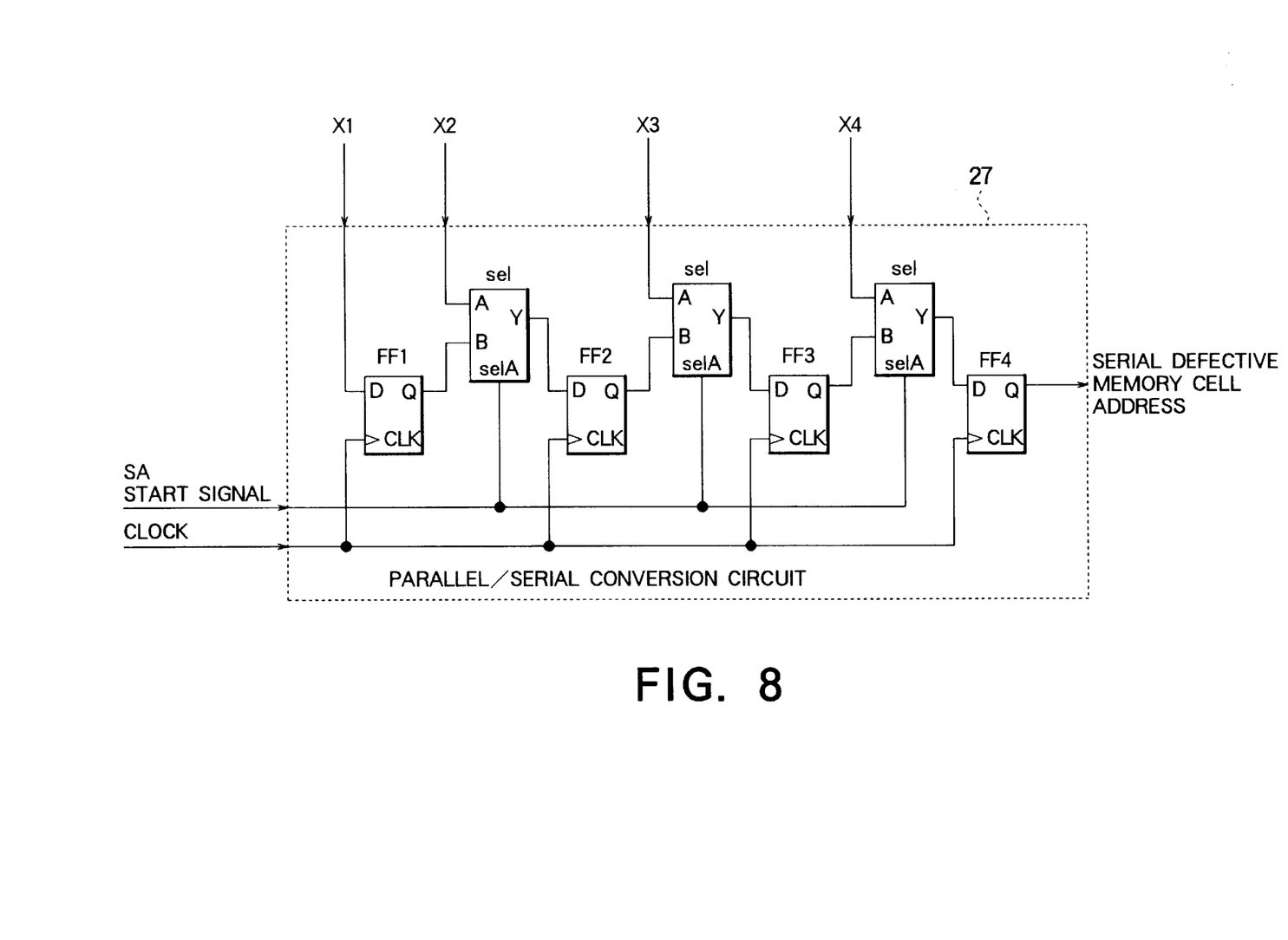
FIG. 8 is a circuit diagram depicting one example of a parallel/serial conversion circuit shown in FIG. 7.

FIG. 8 is a circuit diagram showing one example of the parallel/serial conversion circuit 27 shown in FIG. 7. As shown in FIG. 8, the parallel/serial conversion circuit 27 takes in each of addresses of defective memory cells in response to an SA start signal and converts it to a serial defective memory cell address synchronized with a clock. Here, the clock is in synchronization with each external serial address. Further, each of selectors (sel) is a selector for transmitting an input A to an output Y when a select signal sel A is high in level.

Operation of the memory selective unit 23 shown in FIG. 7 will next be described with reference to timing charts shown in FIGS. 9 and 10. Before an access to each of the external serial addresses is started, the redundant memory selective circuit 25 is first reset. As indicated by T1 in FIGS. 9 and 10, the transistor Tr4 is turned on in response to a precharge signal to bring the memory selective signal MS to a high level.

When the parallel/serial conversion circuit 27 receives the SA start signal for notifying the start of each external serial address therein (during T1 shown in FIGS. 9 and 10), the parallel/serial conversion circuit 27 captures or takes in each address of a defective memory cell and converts it to each of serial defective memory cell addresses, which is synchronized with timing provided to shift the external serial address. Next, the XOR1 29 compares the serial defective memory cell address and the external serial address for each bit (during T2 to T5 in FIGS. 9 and 10) and outputs the result of comparison (defective memory cell identity signal) to the transistor Tr5.

Figure 9:
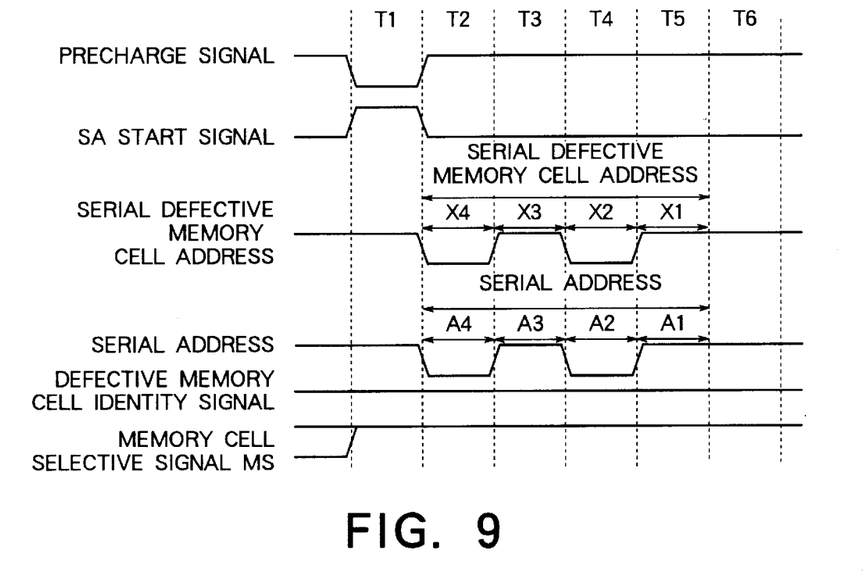
FIG. 9 is a timing chart for describing the operation of the memory selective unit shown in FIG. 7.

When each of the serial defective memory cell addresses (X1, X2, X3 and X4) coincides with each of the external serial addresses (A1, A2, A3 and A4) as shown in FIG. 9, the defective memory cell identity signal is low in level and as a result, the transistor Tr5 is kept in an off state. Therefore, the memory selective signal MS is maintained at a high level precharged before the start of the access. Thus, when the memory selective signal MS is high in level as indicated by T5 in FIG. 9 at the time that the comparison between both addresses has been completed, the external serial address is determined to have specified the address of the defective memory cell.

Figure 10:
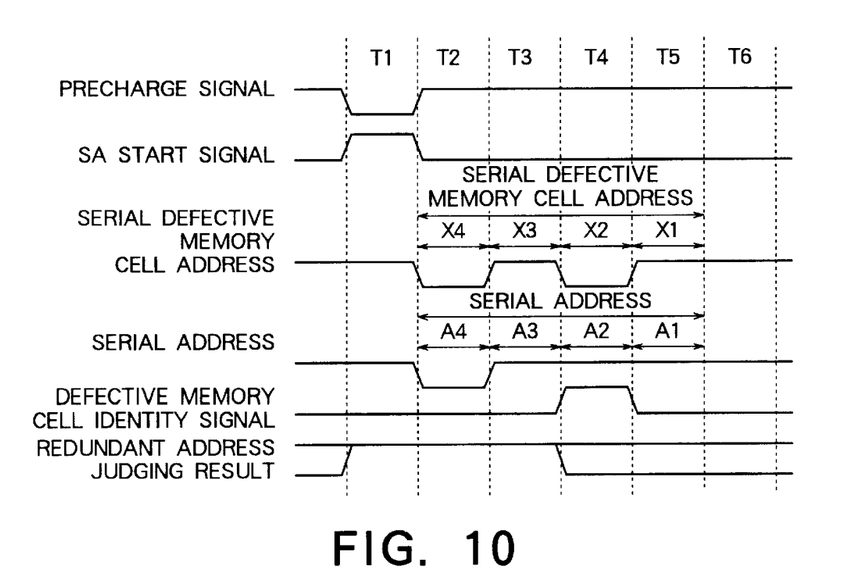
FIG. 10 is a timing chart for describing the operation of the memory selective unit shown in FIG. 7.

On the other hand, when each of the serial defective memory cell addresses (X1 through X4) does not coincide with each of the external serial addresses (A1 through A4) as shown in FIG. 10, the defective memory cell identity signal is high in level as indicated by T4 in FIG. 10 at the time that different bits of both addresses have been detected by the XOR1 29. Therefore, the defective memory cell identity signal holds the transistor Tr5 on to bring the memory selective signal MS to a low level.

Thus, when the memory selective signal MS has been brought to the low level, the external serial address is judged to have specified the normal memory cell. Here, the precharge signal and the SA start signal may be supplied from the outside. Alternatively, they may be generated inside based on external signals.

In the first embodiment of the present invention described above, since the comparison between the external serial address and the address of the defective memory cell is made for each bit, the transistor for introducing or putting the memory selective signal MS into the low level in the redundant memory selective circuit 25 shown in FIG. 7 becomes only the transistor Tr5 shown in FIG. 7. Further, since the load on a COMP (complementary) signal is only the capacitance of a diffusion layer of the transistor, its weight becomes light. When the memory cell specified by the external address is found to be defective, the determination of the memory selective signal MS for replacing the defective memory cell with a redundant memory cell can be speeded up.

Second Embodiment

Figure 11:
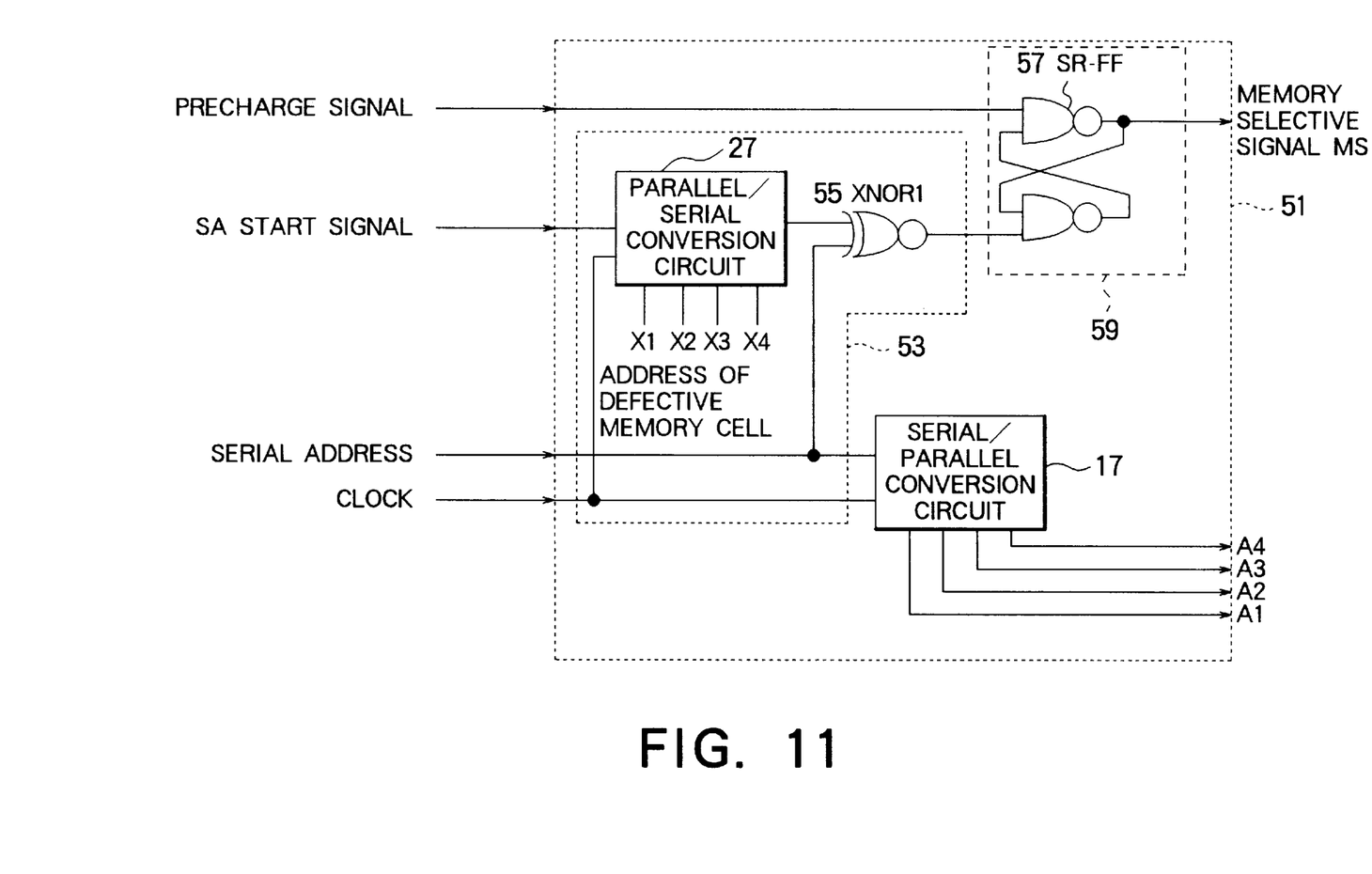
FIG. 11 is a block diagram showing a configuration of a memory selective unit employed in a second embodiment of a semiconductor device of the present invention.

FIG. 11 is a block diagram showing a configuration of a memory selective unit employed in a second embodiment of a semiconductor device of the present invention. The semiconductor device according to the second embodiment has a configuration similar to that of the semiconductor device according to the first embodiment shown in FIG. 6 except for a memory selective unit 51 shown in FIG. 11.

Since addresses of defective memory cells are rendered serial and compared with external serial addresses every bits in the second embodiment as shown in FIG. 11, the conventional redundant memory selective circuit 15 is unnecessary. A judging circuit 53 used as defective address judging element is configured as shown in the drawing. Namely, an exclusive NOR operation circuit (XNOR1) 55 is used in place of the exclusive OR operation circuit XOR1 29 serving as the logical operation circuit of the aforementioned decision circuit 47. Further, an SR flip-flop 57 used as a redundant memory selective circuit 59 is electrically connected to the XNOR1 55.

In the first and second embodiments of the present invention described above, since the direct comparison between the address of the defective memory cell and each external serial address at the initial stage for inputting the external serial address permits elimination of the cycle (T5 shown in FIG. 5) in which only the external address parallel-converted by the final stages (FF3 to FF4) of the conventional serial/parallel conversion circuit 17 shown in FIG. 4 is latched, the determination of the memory selective signal MS for replacing the defective memory cell with the redundant memory cell when the memory cell specified by the eternal address is found to be defective, can be speeded up.

Thus, the present invention can provide a semiconductor device wherein since a cycle in which only an external address parallel-converted by a final means of a conventional serial/parallel conversion circuit can be eliminated by directly comparing an address of a defective memory cell and each external serial address by its input means, a memory selective signal for replacing the defective memory cell with a redundant memory cell when a memory cell specified by the external address is found to be defective, can be determined at high speed.

Further, the present invention can provide a semiconductor device wherein since the comparison between each of external serial addresses and an address of a defective memory cell is made for each bit, a transistor for introducing a memory selective signal MS into a low level in a redundant memory selective circuit becomes only one and since the load on a COMP signal is only the capacitance of a diffusion layer of the transistor, its weight becomes light, thus making it possible to speed up the determination of the memory selective signal MS for replacing the defective memory cell with a redundant memory cell when a memory cell specified by the external address is found to be defective.

What is claimed is:

1. A semiconductor device comprising:

a memory cell array having a plurality of memory cells and for writing data to and reading the same from each of addresses specified by external address signals;

at least one redundant memory cell array for writing and reading data in place of a defective memory cell when the defective memory cell exists in said memory cell array; and a memory selective unit for determining whether one of serially-input addresses corresponds to each of addresses of defective memory cells;

wherein said memory selective unit includes defective address judging means for sequentially judging whether or not the serially-input addresses correspond to the addresses of the defective memory cells without a serial-to-parallel conversion of the serially input addresses;

wherein said memory selective unit includes defective address judging means for judging whether or not said each serially-input address corresponds to an address of a defective memory cell prior to being subjected to serial-to-parallel conversion;

wherein said defective address judging means comprises a parallel/serial conversion circuit for capturing addresses of defective memory cells from external serial addresses, and a logical operation circuit for comparing the addresses of the defective memory cells and the serial addresses and outputting the results of comparison therefrom; and wherein said logical operation circuit comprises an exclusive OR operation circuit, said memory selective unit further comprising a redundant memory selective circuit connected to said exclusive OR operation circuit, and said redundant memory selective circuit outputting a signal for selecting an address of said redundant memory cell array in place of the memory cell array when the results of comparison result in coincidence.

2. A semiconductor device as defined in claim 1, wherein said redundant memory selective circuit is configured in complementary form by a combination of a P-type transistor and an N-type transistor.

3. A semiconductor device comprising:

a memory cell array having a plurality of memory cells and for writing data to and reading the same from each of addresses specified by external address signals;

at least one redundant memory cell array for writing and reading data in place of a defective memory cell when the defective memory cell exists in said memory cell array; and a memory selective unit for determining whether one of serially-input addresses corresponds to each of addresses of defective memory cells;

wherein said memory selective unit includes defective address judging means for sequentially judging whether or not the serially-input addresses correspond to the addresses of the defective memory cells without a serial-to-parallel conversion of the serially input addresses;

wherein said defective address judging means comprises a parallel/serial conversion circuit for capturing addresses of defective memory cells from external serial addresses, and a logical operation circuit for comparing the addresses of the defective memory cells and the serial addresses and outputting the results of comparison therefrom; and wherein said logical operation circuit comprises an exclusive OR operation circuit, said memory selective unit further comprising a redundant memory selective circuit connected to said exclusive OR operation circuit, said redundant memory selective circuit outputs a signal for selecting an address of said redundant memory cell array in place of the memory cell array when the results of comparison result in coincidence.

4. A semiconductor device as defined in claim 3, wherein said redundant memory selective circuit is configured in complementary form by a combination of a P-type transistor and an N-type transistor.

5. A semiconductor device comprising:

a memory cell array having a plurality of memory cells and for writing data to and reading the same from each of addresses specified by external address signals;

at least one redundant memory cell array for writing and reading data in place of a defective memory cell when the defective memory cell exists in said memory cell array; and a memory selective unit for determining whether one of serially-input addresses corresponds to each of addresses of defective memory cells;

wherein said memory selective unit includes defective address judging means for sequentially judging whether or not the serially-input addresses correspond to the addresses of the defective memory cells without a serial-to-parallel conversion of the serially input addresses;

wherein said defective address judging means comprises a parallel/serial conversion circuit for capturing addresses of defective memory cells from external serial addresses, and a logical operation circuit for comparing the addresses of the defective memory cells and the serial addresses and outputting the results of comparison therefrom; and wherein said logical operation circuit comprises an exclusive NOR operation circuit, said memory selective unit further comprising a redundant memory selective circuit connected to said exclusive NOR operation circuit, and said redundant memory selective circuit outputting a signal for selecting an address of said redundant memory cell array in place of the memory cell array when the results of comparison result in inconsistence.

6. A semiconductor device as defined in claim 5, wherein said redundant memory selective circuit has an SR flip-flop.

7. A semiconductor device comprising:

a memory cell array having a plurality of memory cells and for writing data to and reading the same from each of addresses specified by external address signals;

at least one redundant memory cell array for writing and reading data in place of a defective memory cell when the defective memory cell exists in said memory cell array; and a memory selective unit for determining whether one of serially-input addresses corresponds to each of addresses of defective memory cells;

wherein said memory selective unit includes defective address judging means for sequentially judging whether or not the serially-input addresses correspond to the addresses of the defective memory cells without a serial-to-parallel conversion of the serially input addresses;

wherein said memory selective unit includes defective address judging means for judging whether or not said each serially-input address corresponds to an address of a defective memory cell prior to being subjected to serial-to-parallel conversion;

wherein said defective address judging means comprises a parallel/serial conversion circuit for capturing addresses of defective memory cells from external serial addresses, and a logical operation circuit for comparing the addresses of the defective memory cells and the serial addresses and outputting the results of comparison therefrom; and wherein said logical operation circuit comprises an exclusive NOR operation circuit, said memory selective unit further comprising a redundant memory selective circuit connected to said exclusive NOR operation circuit, said redundant memory selective circuit outputting a signal for selecting an address of said redundant memory cell array in place of the memory cell array when the results of comparison result in inconsistence.

8. A semiconductor device as defined in claim 7, wherein said redundant memory selective circuit has an SR flip-flop.

9. A memory selective unit suitable for use in a semiconductor device, for determining whether or not an address specified by external serial address signals indicates a defective memory cell, to replace the defective memory cell with a redundant memory cell for writing data into and reading it therefrom when the defective memory cell exists in a memory cell array for writing data to and reading it therefrom in accordance with the specified address, said memory selective unit comprising defective address judging means for sequentially judging whether or not serially-input addresses correspond to addresses of defective memory cells without a serial-to-parallel conversion of the serially-input addresses;

wherein said defective address judging means comprises a parallel/serial conversion circuit for capturing each of addresses of the defective memory cells based on an externally-input SA start signal and converting the address to a serial defective memory cell address synchronized with timing provided to shift each of external serial addresses, and a logical operation circuit for comparing the serial defective memory cell address and the external serial address for each bit and outputting the result of comparison therefrom; and wherein the memory selective unit further comprises a redundant memory selective circuit for capturing an identity signal therein and outputting a memory selective signal therefrom, and a serial/parallel conversion circuit for converting said each input serial address to a parallel address, wherein said logical operation circuit comprises an exclusive OR operation circuit connected to said redundant memory selective circuit, and outputting said identity signal as the result of comparison when said serial defective memory cell address coincides with said each external serial address.

10. A memory selective unit as defined in claim 9, wherein said redundant memory selective circuit is configured in a complementary format provided with a P-type transistor and an N-type transistor.

11. A memory selective unit as defined in claim 9, further comprising a redundant memory selective circuit for taking in a non-identity signal and outputting a memory selective signal, and a serial/parallel conversion circuit for converting said each input serial address to a parallel address, wherein said logical operation circuit comprises an exclusive NOR circuit connecting to said redundant memory cell and outputting said non-identity signal when said serial defective memory cell addresses and said external serial addresses result in inconsistency.

12. A memory selective unit as defined in claim 11, wherein said redundant memory selective circuit has an SR flip-flop.

* * * * *